United States Patent
Tokumitsu et al.

(10) Patent No.: US 6,600,381 B2
(45) Date of Patent: Jul. 29, 2003

(54) MICROWAVE VOLTAGE-CONTROLLED-OSCILLATOR

(75) Inventors: Tsuneo Tokumitsu, Nakakoma (JP); Osamu Baba, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/814,753

(22) Filed: Mar. 23, 2001

(65) Prior Publication Data

US 2001/0026195 A1 Oct. 4, 2001

(30) Foreign Application Priority Data

Mar. 29, 2000 (JP) ......................................... 2000-090405

(51) Int. Cl.[7] .............................. H01P 7/08; H03B 5/18
(52) U.S. Cl. .............................. 331/177 V; 331/107 SL
(58) Field of Search ....................... 331/177 V, 107 SL, 331/36 C

(56) References Cited

U.S. PATENT DOCUMENTS

| 4,375,621 A | | 3/1983 | Schneiter et al. ......... 332/16 T |
| 4,904,964 A | * | 2/1990 | Peng et al. ................. 332/123 |
| 5,352,994 A | * | 10/1994 | Black et al. .................. 333/33 |
| 5,929,712 A | * | 7/1999 | Kuriyama .................... 331/25 |

FOREIGN PATENT DOCUMENTS

| GB | 2 338 617 A | 12/1999 |
| JP | 8-288715 | 11/1996 |

OTHER PUBLICATIONS

"A Millimeter Wave Monolithic VCO with an Integrated Heterojunction FET as a Varactor" Keiichi Ohata, Masahiro Funabashi, Takashi Inoue, Kazuhiko Onda, Kenichi Hosoya, Kenichi Maruhashi and Masaaki Kuzuhara; vol. 2 CONF. 24, Sep. 5, 1994; pp. 1667–1672; XP000678270.

"GaAs Monolithic Circuit for FMCW radars"; Leblanc et al; IEEE 1988 Microwave and Millimeter–Wave Monolithic Circuits Symposium, Digest of Papers (CAT. No. 88CH2591–6), New York, NY; May 24–25, 1998; pp. 109–111; XP002197572; 1988.

* cited by examiner

Primary Examiner—Robert Pascal
Assistant Examiner—Joseph Chang
(74) Attorney, Agent, or Firm—Arent Fox Kintner Plotkin & Kahn, PLLC

(57) ABSTRACT

A negative resistance circuit having an output terminal is connected to a first terminal of a strip shaped resonator. Anode of a variable capacitance diode is connected to a second terminal of the strip shaped resonator via a capacitor 1'. Cathode of the variable capacitance diode is grounded. One terminal of a high impedance strip shaped line is connected to the anode of the variable capacitance diode. Other terminal of the strip shaped line is grounded via a capacitor 4. The capacitor 4 has sufficiently low impedance at an oscillation frequency.

10 Claims, 8 Drawing Sheets

MICROWAVE VOLTAGE-CONTROLLED-OSCILLATOR

FIELD OF THE INVENTION

The present invention in general relates to a microwave voltage controlled oscillator, such as the automobile radar, that performs narrow band modulation. More particularly, this invention relates to a microwave voltage controlled oscillator in which frequency modulation linearity is improved.

BACKGROUND OF THE INVENTION

A conventional microwave voltage controlled oscillator will be described. FIG. 1 is a diagram showing a principle configuration of a typical microwave voltage controlled oscillator. Legend 61 denotes a negative resistance element (circuit), legend 62 denotes a resonator circuit, and legend 63 denotes a variable capacitance diode. This microwave voltage controlled oscillator is a well known combination of a variable capacitance diode and negative resistance.

It will be assumed here that, the impedance of the resonator circuit 62 which is to the left of the reference line A–A' is $Z_R$, and that the impedance of the negative resistance element 61 which is to the right of the reference line A–A' is $Z_N$. With this assumption in mind, the microwave voltage controlled oscillator oscillates stably when the following equation (1) holds true. That is, $$Re\{Z_R+Z_N\}<0$$
$$Im\{Z_R+Z_N\}=0 \quad (1)$$
$$d\{Z_R+Z_N\}/d\omega>0$$

where $\omega$ represents angular frequency.

It will be further assumed that the impedance of the variable capacitance diode 63 (capacitance $C_V$) which is to the left of the reference line B–B' is $1/j\omega C_V$, and that the impedance of the resonator circuit 62 which is to the right of the reference line is $R_T+j\omega L_T$. With this assumption in mind, the oscillation frequency $f_{osc}$ of the oscillator can be represented by the following equation (2).

$$f_{osc}=1/[2\pi(L_T C_V)^{1/2}] \quad (2)$$

When the variable range of the frequency is very narrow and $L_T$ can be regarded as constant in the whole variable frequency range, an oscillation frequency proportionate to the control voltage can be obtained if the capacitance $C_V$ is in inverse proportion to the square of the control voltage. However, a variable capacitance diode having a capacitance $C_V$ which is in inverse proportion to the square of the control voltage is not commercially available. Furthermore, as for a special diode capable of operating at a frequency equivalent to at least a microwave frequency, it is difficult to obtain even if it exists. Under a condition that $L_T$ is constant, therefore, a linear voltage controlled oscillator as described above has not been implemented.

FIG. 2 is a diagram showing a circuit configuration of the conventional microwave voltage controlled oscillator. Legend 64 denotes the above described shorted quarter—wavelength line as high impedance shunt stub. The quarter wavelength line becomes infinite in impedance at an oscillation frequency, and it does not affect the oscillation operation at the microwave frequencies. Therefore, the voltage-capacitance characteristic of the variable capacitance diode determines the linearity of frequency modulation.

FIG. 3 is a diagram showing a variable frequency characteristic and frequency modulation linearity (% indication) of the conventional microwave voltage controlled oscillator shown in FIG. 2. Specifically, FIG. 3A represents the oscillation frequency—control voltage characteristic, and FIG. 3B represents the linearity of frequency modulation.

The linearity (i.e. the linearity index) of frequency modulation is defined by the oscillation frequency—control voltage characteristic shown in FIG. 3A. For example, assuming that a maximum deviation between a straight line coupling both ends of a frequency modulation width W and illustrated frequencies is $\Delta W$, the linearity index can be represented by $100 \times \Delta W/W$ (%). To be concrete, the linearity index becomes at least 20% as shown in FIG. 3B.

This does not exert influence upon fixed frequency oscillators for communication. For example, in devices for transmitting and receiving a frequency modulated signal and measuring a distance between cars, such as a crash prevention radar, however, this indicates a value remarkably degrading the precision of measurement results. In other words, even in the case where it is attempted to improve the precision by using some external frequency linearizer such as using ROM, the linearity index can not be suppressed enough. In the case of crash prevention radar, however, the frequency modulation width is negligibly small as compared with the oscillation frequency and a nearly fixed frequency can be considered.

A conventional linear microwave voltage controlled oscillator will now be described in detail by referring to a concrete example. FIG. 4 is a diagram showing a configuration of a microwave voltage controlled oscillator (high frequency device) described in Japanese Patent Application Laid-Open No. 8-288715. Legend 31 denotes a resonator circuit, legend 32 denotes a capacitance (realized with a capacitor), and legend 33 denotes a negative resistance circuit (realized with amplifier circuit).

Furthermore, in the resonator circuit 31, legend 47 denotes a main resonance line, legend 48 denotes a DC-cut capacitance, and legend 49 denotes a variable capacitance diode having a capacitance which is in inverse proportion to the square of voltage. Legend 52 denotes a series connection of a strip line 50 for correcting the square characteristic of the variable capacitance diode 49 to obtain a linear characteristic and a capacitor 51. Legend 53 denotes a strip line for further improving the correction effect of the strip line 50. Legend 54 denotes a terminal, and legend 55 denotes a capacitor. In the negative resistance circuit 33, legend 34 denotes a transistor, legends 35, 36, 37 and 38 denote resistors, legends 39, 40, 41, 42 and 43 denote capacitors, legend 44 denotes a coil, and legends 45 and 46 denote terminals.

In this microwave voltage controlled oscillator, for example, when a strip line is used as a distributed transmission line in the resonator circuit 31 and the variable frequency range is wide, $L_T$ changes linearly with the frequency. Even when the capacitance $C_V$ is inverse proportion to the square of the voltage, the oscillation frequency is not proportionate to the control voltage. Therefore, a correction circuit (corresponding to the strip line 50 and the strip line 53) is incorporated so that the capacitance of the variable capacitance diode 49 will change linearly with the applied voltage. Furthermore, lengths of the strip lines 50 and 53 are defined as 1/10 wavelength to 1/20 wavelength and 3/16 wavelength to 5/16 wavelength, respectively, in order to modulate the oscillation frequency in a wide frequency band.

An explanation will be given about the strip line 50. If the strip line 50 is not provided, changing the voltage only slightly causes an abrupt change of the above described variable capacitance when the control voltage is low, resulting in an abrupt change of the oscillation frequency. When the control voltage is high, the oscillation frequency changes gently as the voltage changes.

However, when strip line 50 is provided, the strip line 50 changes the impedance abruptly, and consequently the oscillation frequency changes gradually. In keeping therewith, the oscillation frequency changes linearly as the control voltage increases. In order to satisfy the expression "the strip line 50 changes the impedance abruptly, and consequently," it is important that the impedance of the correction circuit has a great change at different frequencies. Especially here, the series connection 52 for generating a great impedance change with respect to a frequency is connected in parallel with the variable capacitance diode 49.

In the conventional microwave voltage controlled oscillator, the correction circuit (the strip line 50 and the strip line 53) is thus incorporated so that the capacitance of the variable capacitance circuit with diode 49 may change linearly with the applied voltage. Furthermore, by determining the lengths of the strip lines 50 and 53 to be 1/10 wavelength to 1/20 wavelength and 3/16 wavelength to 5/16 wavelength, respectively, the oscillation frequency is modulated linearly in a broad frequency band.

In a crash prevention radar, however, frequency modulation of approximately 50 MHz is conducted in a 38 GHz band, for example, a frequency modulated wave of a 76 GHz band obtained by frequency multiplication thereof with a ratio of two is transmitted and received, and a distance between the radar and the target is measured. In this case, a great difference from a fixed frequency disappears. Therefore, a frequency change width for abruptly changing the impedance does not exist. To be concrete, there is a problem that the frequency band becomes very narrow with the specific bandwidth equivalent to approximately 0.3% and the function of the above described correction circuit cannot be used.

Furthermore, in the conventional microwave voltage controlled oscillator in which a correction value $C_M$ of capacitance $C_V$ of the variable capacitance diode is changed linearly with the voltage in operation close to the above described fixed frequency, $L_T$ is a nearly fixed value as evident from the equation (2) ($C_V$ in the equation (2) is replaced with $C_M$). Since $L_T$ is a nearly fixed value, there is obtained such a variable frequency characteristic that the oscillation frequency $f_{osc}$ becomes proportionate to $(-\frac{1}{2})$th power of the voltage. In this case, the modulation linearity value becomes at least 20%. (In the change rate of a modulation sensitivity in a constant modulation width, the dependence of the oscillation frequency upon the voltage approaches a straight line as the modulation linearity value approaches 0%.) This results in a problem that the conventional microwave voltage controlled oscillator becomes unsuitable for the voltage controlled oscillator for crash prevention radar.

SUMMARY OF THE INVENTION

It is an object of the present invention to obtain a microwave voltage controlled oscillator which can be applied to a crash preventing radar by improving the modulation linearity value as compared with the conventional technique.

In the microwave voltage controlled oscillator according to this invention a negative resistance circuit having an external output terminal is connected to a first terminal of a strip shaped resonator, and an anode of a variable capacitance diode is connected to a second terminal of the strip shaped resonator via first capacitance, a cathode of the variable capacitance diode is connected to ground, a first terminal of a high impedance strip shaped line is connected to the anode of the variable capacitance diode, and a second terminal of the strip shaped line is connected to the ground via second capacitance having sufficiently low impedance at an oscillation frequency. Furthermore, length of the strip shaped line is set to a value in a range of 1/4 wavelength to 1/14 wavelength.

Because of such a configuration, and because the line length of the strip shaped line is in the range of 1/4 wavelength to 1/14 wavelength, the linearity of the frequency modulation can be remarkably improved as compared with, for example, when frequency control is effected by using only a diode.

Furthermore, by utilizing the fact that negative admittance equivalently obtained from the strip shaped line is connected to the variable capacitance diode, the length of the strip shaped line is determined so that sum of capacitance of the variable capacitance diode and the admittance will be in inverse proportion to the control voltage. By this determination, the conventional linearity index can be remarkably improved. Furthermore, since the remarkable improvement of the linearity index can facilitate the application of the linearizer, an oscillator for crash preventing radar can be effectively implemented.

Furthermore, by utilizing the fact that negative admittance equivalently obtained from the strip shaped line is connected to the variable capacitance diode, the length of the strip shaped line is determined so that sum of capacitance of the variable capacitance diode and the admittance will be in inverse proportion to first to second power of the control voltage. As compared with a microwave voltage controlled oscillator using a variable capacitance diode which is in inverse proportion to the one-half power of the control voltage, therefore, a twice line length can be used. Furthermore, it is possible to prevent lowering in design efficiency and reproducibility resulting from the line length of the strip shaped line becoming too short.

The length of the strip shaped line is fixed to 1/4 wavelength, and the strip shaped line is connected to the ground in a predetermined position depending on a characteristic of the variable capacitance diode in use. By fixing the line length of the strip shaped line to 1/4 wavelength and connecting the strip shaped line to the ground in an arbitrary position, therefore, fine adjustment can be performed so as to absorb dispersion of the $C_V$ characteristic of the variable capacitance diode without limiting the kind of the variable capacitance diode. As a result, the linearity of the frequency modulation can be further remarkably improved.

Furthermore, a Schottky diode or a FET diode is used as the variable capacitance diode. When the Schottky diode or the FET diode is used, the linearity of the frequency modulation can also be remarkably improved as compared with the conventional technique.

Other objects and features of this invention will become apparent from the following description with reference to the accompanying drawings.

DESCRIPTION OF THE PREFERRED EMBODIMENTS

Figure 1:
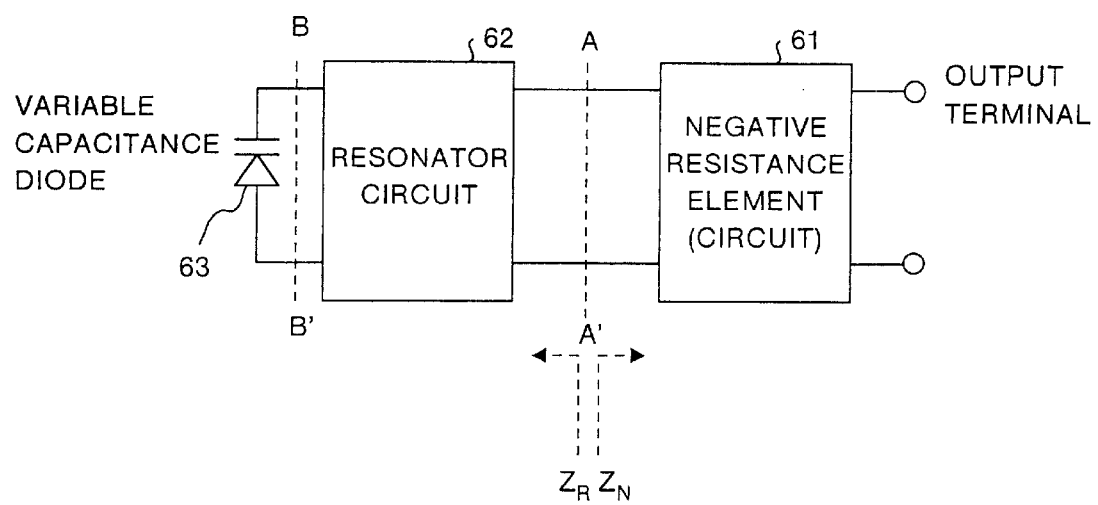
FIG. 1 is a diagram showing a principle configuration of a typical microwave voltage controlled oscillator.
Figure 2:
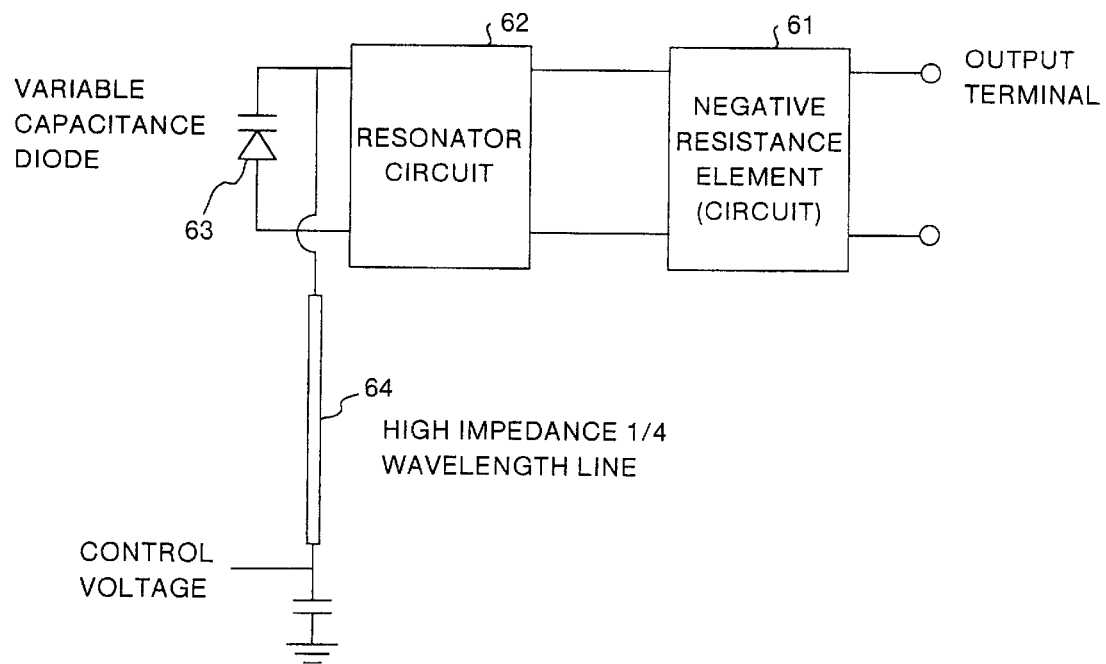
FIG. 2 is a diagram showing a circuit configuration of a conventional microwave voltage controlled oscillator.

Preferred embodiments of a microwave voltage controlled oscillator according to the present invention will be described in detail by referring to the drawing. The present invention is not restricted by these embodiments.

Figure 5:
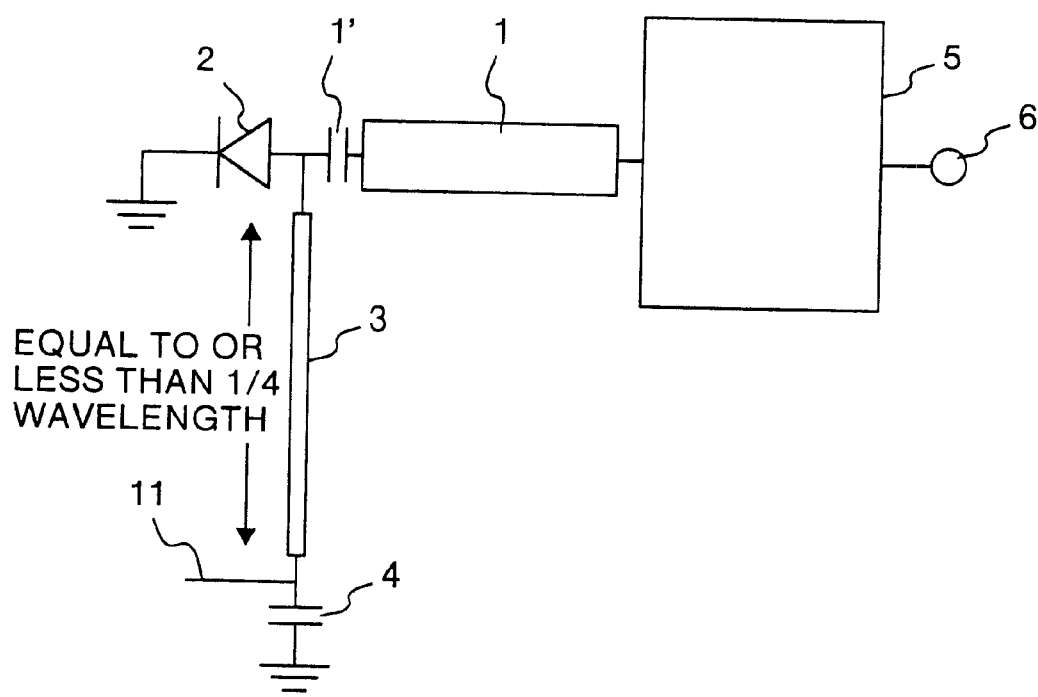
FIG. 5 is a diagram showing a configuration of a first embodiment of a microwave voltage controlled oscillator according to the present invention.

FIG. 5 is a diagram showing a configuration of a first embodiment of a microwave voltage controlled oscillator. In FIG. 5, legend 1 denotes a strip shaped resonator, legend 2 denotes a variable capacitance diode, legend 3 denotes a strip shaped line, legends 1' and 4 denote capacitances (realized with capacitors), legend 5 denotes a negative resistance circuit, legend 6 denotes an output terminal, and legend 11 denotes a voltage application terminal to the variable capacitance diode 2.

In this microwave voltage controlled oscillator, the negative resistance circuit 5 is connected to a first terminal of the strip shaped resonator 1, and anode of the variable capacitance diode 2 is connected to a second terminal of the strip shaped resonator 1 via capacitance 1'. Cathode of the variable capacitance diode is connected to the ground, and a first end of the high impedance strip shaped line 3 is connected to the anode of the variable capacitance diode 2. A second end of the strip shaped line 3 is connected to the ground via capacitance 4 which is sufficiently low impedance at the oscillation frequency. Furthermore, the length of the strip shaped line 3 is set to a range of at most a quarter of wavelength.

The variable capacitance diode 2 and the strip shaped line 3 are thus connected in parallel and connected to the ground. Equivalently, therefore, negative admittance of $-1/(\omega_0 Z \tan \beta l)$ obtained from the strip shaped line 3 (having a length l) is connected to the variable capacitance diode 2. By the way, the fixed oscillation angular frequency is $\omega_0$, the characteristic impedance of the strip shaped line 3 is Z, and the phase constant is $\beta$.

Therefore, the capacitance $C_T$ (V) connected to the strip shaped resonator 1 via the capacitance 1' can be represented by equation (3).

$$C_T = C_V - (1/\omega_0 Z \tan \beta l) \quad (3)$$

This equation represents that a voltage variable capacitance $C_V$ (vertical axis)–voltage (horizontal axis) curve described later is shifted downward by $\Delta C$.

Furthermore, typically the capacitance $C_V$ (V) of the variable capacitance diode 2 can be represented by the following equation (4).

$$C_V = a/(1-V)^K \quad (4)$$

where K is a positive constant and "a" is a constant.

Therefore, the case where the capacitance $C_V$ is shifted becomes equivalent to the case where the value of the constant K is made large at substantially all voltages, on the basis of the above described equation. By using this effect, inverse proportionality of the capacitance $C_T$ to the square of the control voltage V, or a characteristic which is close to that is implemented by the strip shaped line 3 in the present embodiment. By the way, in the case where frequency modulation is performed in a narrow frequency band, the angular frequency $\omega_0$ may be made constant. Furthermore, since shift of a fixed value holds true at all modulation frequencies, there is no need of frequency correction.

What happens when the length of the strip shaped line 3 is set to the range of, for example, ¼ wavelength to ¹⁄₁₄ wavelength will be explained. For example, when the wavelength is ¼, it follows that $\Delta C=0$ and the above described shift does not occur. Therefore, the case can be applied to the case where the $C_V$ characteristic of the variable capacitance diode 2 is in inverse proportion to the square of the control voltage V. On the other hand, when the length of the strip shaped line 3 is shorter than ¼ wavelength, the above described shift occurs. Therefore, when the length of the strip shaped line 3 is shorter than ¼ wavelength can be applied to the case where the $C_V$ characteristic of the variable capacitance diode 2 is in inverse proportion to the kth power of the control voltage V (where ½<k<2). Furthermore, the length l of the strip shaped line 3 is set according to the k value of the $C_V$ characteristic. In the whole control voltage range, the k value of the $C_T$ characteristic is made effectively large to improve the frequency linearity.

Furthermore, in the present embodiment, a voltage is supplied to the variable capacitance diode 2 stably without loss by connecting the strip shaped line 3 to the ground via the capacitance 4.

Figure 6:
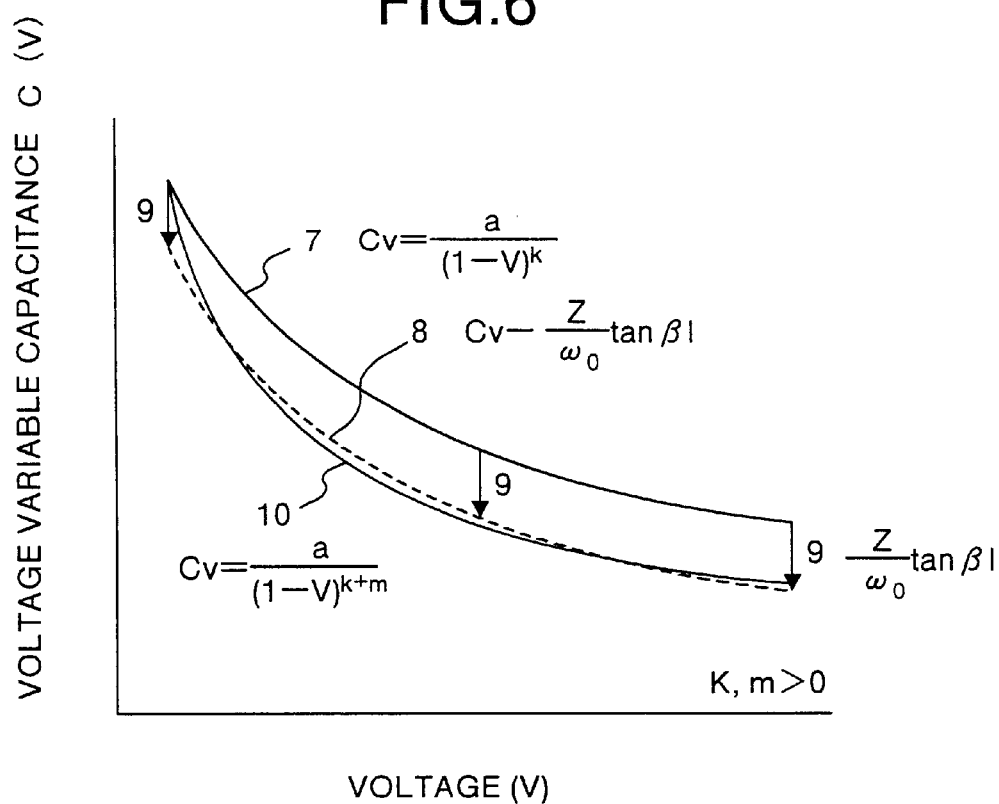
FIG. 6 is a diagram showing a capacitance—voltage characteristic in the case where a strip shaped line having a length of ¼ wavelength to ¹⁄₁₄ wavelength is connected in parallel with a variable capacitance diode.

FIG. 6 is a diagram showing a capacitance—voltage characteristic obtained when the shorted high impedance line (the strip shaped line 3) having a length of ¼ wavelength to ¹⁄₁₄ wavelength is connected in parallel to the variable capacitance diode 2. A thick solid curved line 7 shows a capacitance—voltage characteristic ($C_V$ characteristic) of the variable capacitance diode 2. The capacitance $C_V$ can be represented by the equation (4) (½<k<2). In other words, when the voltage (absolute value) is increased, the capacitance greatly reduces in the low voltage region and the capacitance gently decreases in the high voltage region.

A broken curved line 8 is obtained by shifting the curved line 7 by effective negative capacitance 9 provided by the strip shaped line 3 according to the equation (3). This curved line 8 coincides with a thin solid curved line 10 at a substantially all voltages. The curved line 10 can be represented by the following equation (5).

$$C_V = a/(1-V)^{k+m} \quad (5)$$

where m is a positive integer.

The equation (5) means that capacitance of, for example, k=½ can be converted to capacitance of k=1 by the strip shaped line 3. In other words, as k becomes great from ½, the length of the strip shaped line 3 is elongated appropriately. And when the capacitance is decreased by, for example, the capacitance shift value 9, it is converted to the capacitance of k=1. Furthermore, when the shift value of the capacitance is kept great (the strip shaped line 3 is kept short), equivalence to the capacitance of k=2 can also be implemented.

By using the configuration shown in FIG. 5 and furthermore making the line length l of the strip shaped line 3 equal to a length in the range of ¼ wavelength to ¹⁄₁₄ wavelength, the linearity of the frequency modulation can be thus improved remarkably in the present embodiment as compared with the case where frequency control is effected by using only a diode. The present embodiment has been described assuming that a Schottky diode is used as the variable capacitance diode 2. However, the variable capacitance diode 2 is not limited thereto. For example, Schottky junction capacitance of a field effect transistor (FET) can also be utilized for frequency modulation.

Figure 7:
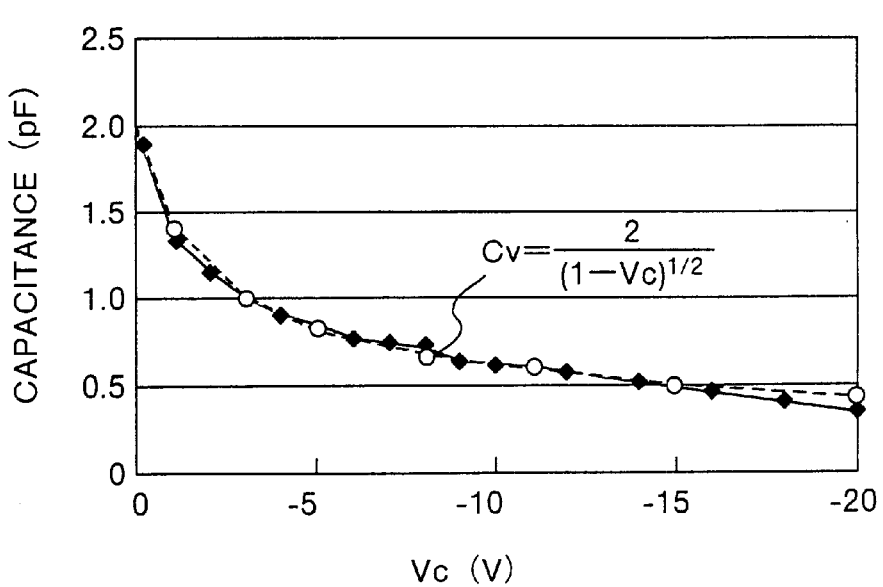
FIG. 7 is a diagram showing processing of a second embodiment in a microwave voltage controlled oscillator according to the present invention.
Figure 8:
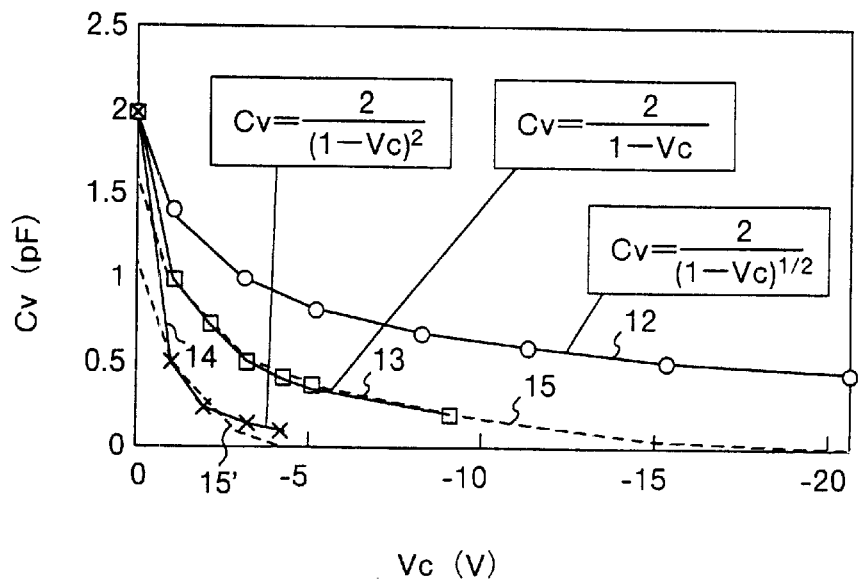
FIG. 8 is a diagram showing processing of a second embodiment in a microwave voltage controlled oscillator according to the present invention.

FIG. 7 and FIG. 8 are diagrams showing processing of a second embodiment in a microwave voltage controlled oscillator according to the present invention. The linearity of frequency modulation of the variable capacitance diode 2 in the case of the operation frequency of the 10 GHz band and k=½ is improved. The second embodiment has the same configuration as that of the microwave voltage controlled oscillator of the first embodiment shown in FIG. 5. Therefore, description of the configuration of the second embodiment will be omitted. Here, the capacitance—voltage characteristic of the variable capacitance diode will be prescribed.

In FIG. 7, a curve passing through rhombi represents measured values of the $C_V$ characteristic of a typical variable capacitance diode. This curve coincides with, for example, a curve passing through circles indicated by the following equation (6), at very high precision.

$$C_V = 2/(1-V)^{1/2} \quad (6)$$

Furthermore, on the basis of the equation (6), curves of the following equation (7) and equation (8) are derived and results thereof are superimposed on a table of the $C_V$ characteristic. FIG. 8 is a diagram showing such a state that the equations (6) to (8) are superimposed.

$$C_V = 2/(1-V)^1 \quad (7)$$

$$C_V = 2/(1-V)^2 \quad (8)$$

In FIG. 8, legend 12 denotes a curved line of the equation (6) representing the $C_V$ characteristic of the above described typical variable capacitance diode (Schottky diode). Legend 13 denotes a curved line of the equation (7), and legend 14 denotes a curved line of the equation (8). Legend 15 denotes a curved line obtained by shifting the curved line 12 downward until it substantially coincides with the curved line 13. Legend 15' denotes a curved line obtained by further shifting the curved line 12 downward until it substantially coincides with the curved line 14. Here, ΔC is set to 0.5 pF.

The curved line 15 coincides with the curved line 13 in a wide voltage range, and the curved line 15' coincides with the curved line 14 in a limited voltage range. As illustrated in FIG. 8, the capacitance shift effect caused by the strip shaped line 3 becomes thus effective in implementing a $C_V$ characteristic of high order, i.e., a $C_V$ characteristic close to the ideal characteristic.

In the second embodiment, therefore, the fact that negative admittance $-1/(\omega_0 Z \tan \beta 1)$ equivalently obtained from the strip shaped line 3 (length l) is connected to the variable capacitance diode 2 is utilized. The length of the strip shaped line 3 is selected so that the sum of the capacitance of the variable capacitance diode 2 and the above described admittance will be substantially in inverse proportion to the control voltage. In other words, if the $C_V$ characteristic of the variable capacitance diode 2 is in inverse proportion to the one-half power of the control voltage V, then such a variable capacitance characteristic that the above described capacitance $C_T$ characteristic is in inverse proportion to the control voltage V is implemented by using the strip shaped line 3 having a length of, for example, approximately ¹⁄₁₂ wavelength, in the present embodiment.

For example, relations represented by an equation (9) hold true between the capacitance shift value ΔC and the line length l on the basis of the above described equation (3), $$\Delta C = 1/\{\omega_0 Z \tan(2\pi l/\lambda g)\}$$

and $$Z \tan(2\pi l/\lambda g) = 1/\omega_0 \Delta C \quad (9)$$

where λg represents the wavelength. Since $C_V$ is set to a smaller value as the frequency becomes higher, $\omega_0 \Delta C$ becomes substantially constant irrespective of the frequency in the case where a desired $C_V$ characteristic is to be implemented.

In FIG. 8, it is now assumed that the shift value ΔC from the curved line 12 to the curved line 13 is 0.5 pF, the resistance value Z is in the range of 70 to 80Ω (assuming practically that the substrate thickness is in the range of 150 to 250 μm and the line width is 50 μm), and the operation frequency is 10 GHz. In this case, the above described Z tan(2πl/λg) can be derived by the following equation.

$$Z \tan(2\pi l/\lambda g) = 100/\pi = 31.8 \quad (10)$$

At this time, in the above described range of Z, tan(2πl/λg) becomes 0.4 to 0.46 (25° to 30°) and the line length l becomes ¹⁄₁₄ wavelength to ¹⁄₁₂ wavelength. In other words, the $C_V$ characteristic which is in inverse proportion to the voltage can be implemented by making the line length l equal to a value in the range of ¹⁄₁₄ wavelength to ¹⁄₁₂ wavelength. Furthermore, by making the shift value ΔC equal to 1 pF and making the line length l equal to a value in the range of approximately ¹⁄₂₈ wavelength to ¹⁄₂₄ wavelength, the $C_V$ characteristic which is in inverse proportion to the square of the voltage can be implemented in a limited voltage range.

Figure 3A:
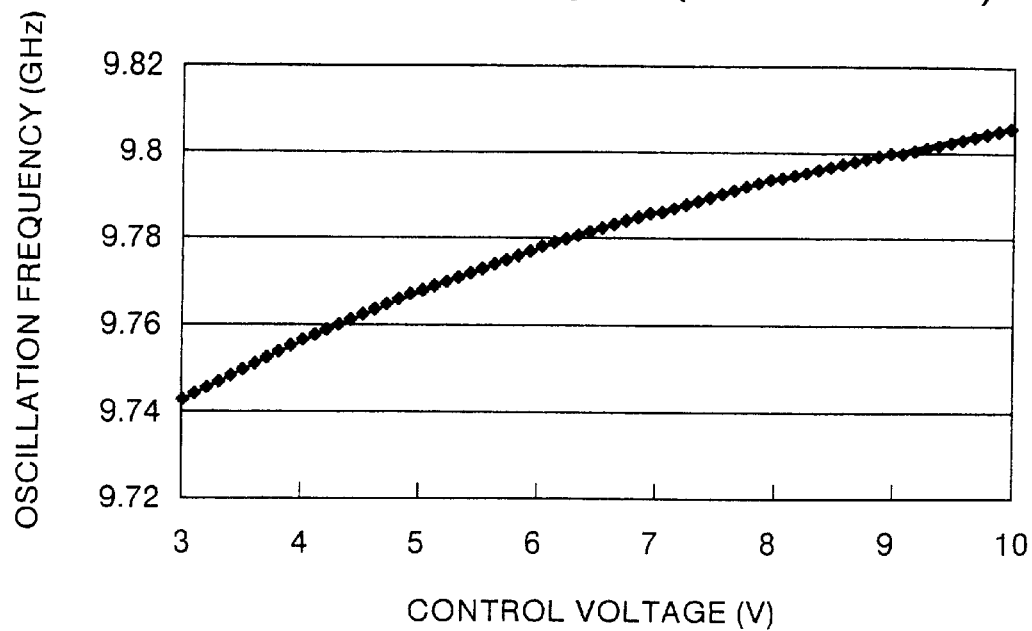
FIG. 3A and FIG. 3B are diagrams showing a variable frequency characteristic and linearity of frequency modulation of a conventional microwave voltage controlled oscillator shown in FIG. 2.
Figure 3B:
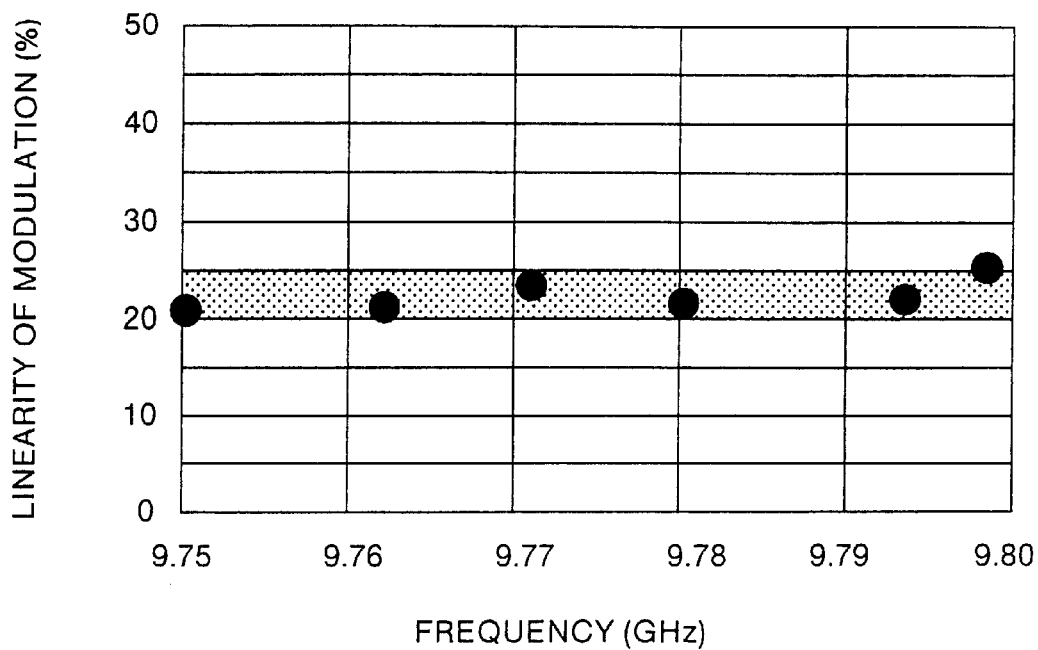
Figure 4:
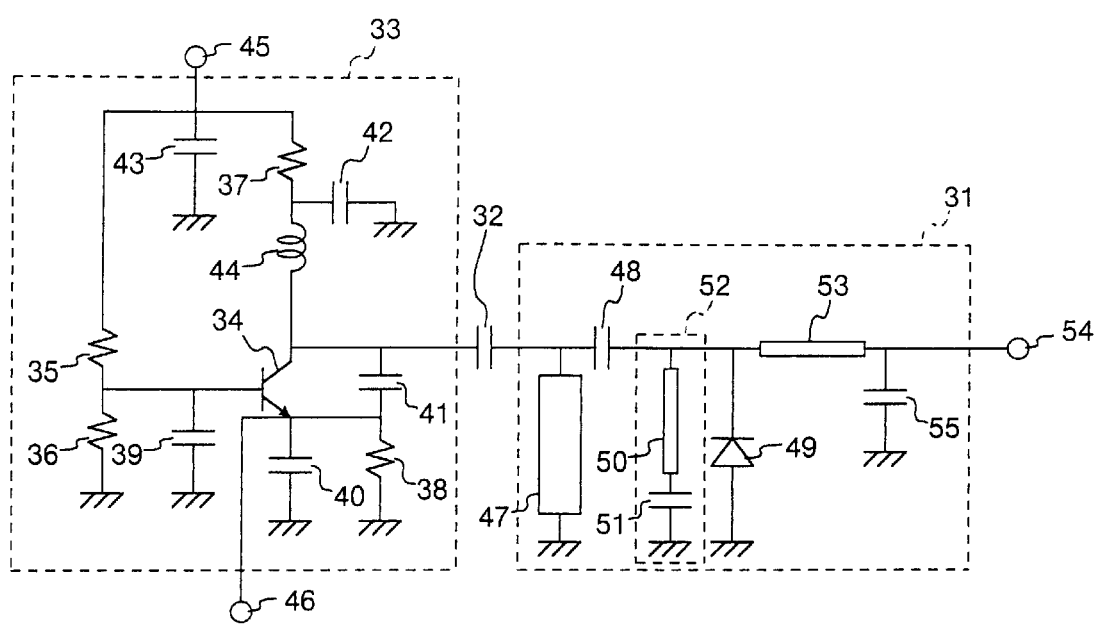
FIG. 4 is a diagram showing a configuration of a microwave voltage controlled oscillator described in Japanese Patent Application Laid-Open No. 8-288715.
Figure 9:
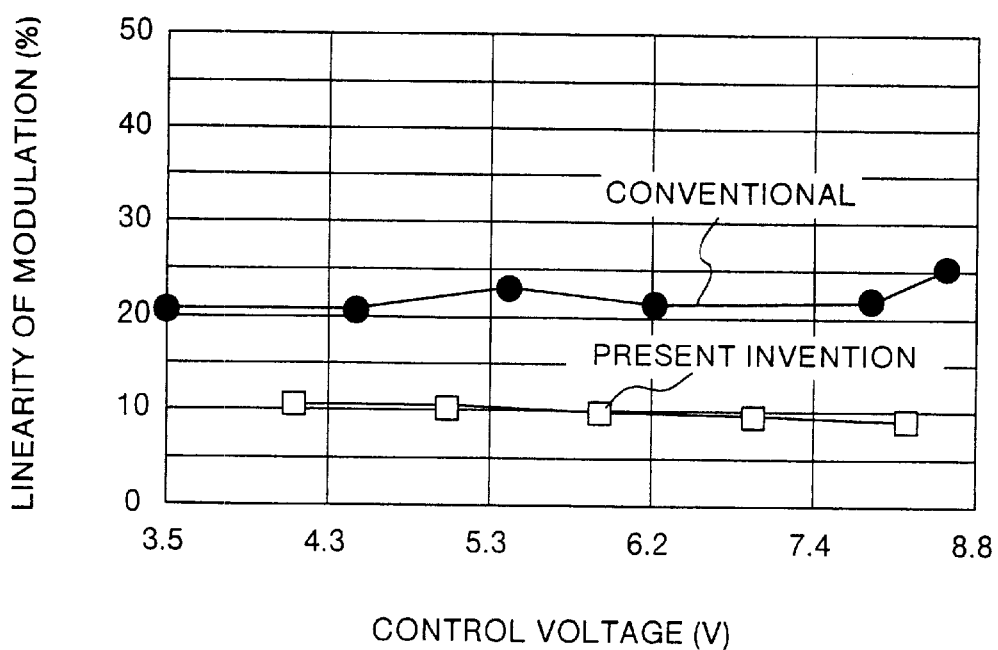
FIG. 9 is a diagram showing a linearity of frequency modulation of a microwave voltage controlled oscillator according to the present invention.

FIG. 9 is a diagram showing that the linearity of the conventional frequency modulation shown in FIG. 3 has been improved by the method of determining the length of the strip shaped line 3 in the second embodiment. Thus, in the second embodiment, the linearity index which has been conventionally at least 20% can be improved up to approximately 10% by determining the length of the strip shaped line 3 as described above. Furthermore, since this can facilitate application of a linearizer, an oscillator for crash prevention can be effectively implemented.

In the second embodiment, the case where a Schottky diode is used as the variable capacitance diode 2 has been described. However, the configuration is not limited thereto. For example, the Schottky junction capacitance of a field effect transistor (FET) can also be utilized for frequency modulation.

Figure 10:
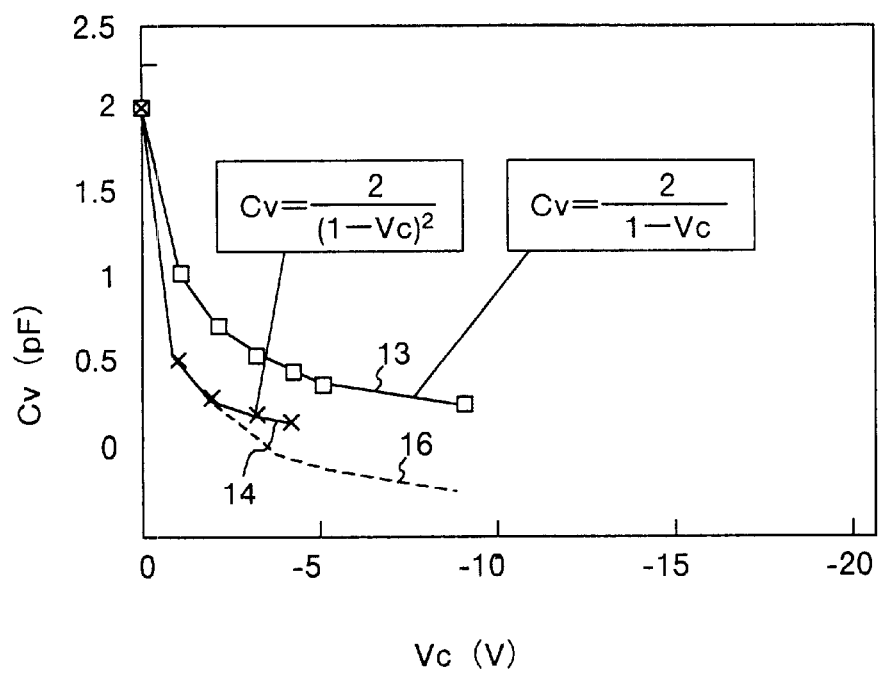
FIG. 10 is a diagram showing processing of a third embodiment in a microwave voltage controlled oscillator according to the present invention.

FIG. 10 is a diagram showing processing of a third embodiment of a microwave voltage controlled oscillator according to the present invention. It can be understood that, the linearity of the frequency modulation of the variable capacitance diode 2 in the case of the operation frequency of 10 GHz and k=1 can be improved. The configuration in this third embodiment is the same as that of the microwave voltage controlled oscillator of the first embodiment shown in FIG. 5. Therefore, description of the configuration of the third embodiment will be omitted.

In FIG. 10, legend 13 denotes a curved line of the above described equation (7), and legend 14 denotes a curved line of the above described equation (8). Legend 16 denotes a curved line obtained by shifting the curved line 13 downward until it substantially coincides with the curved line 14. Here, ΔC is set to 0.5 pF. The curved line 16 coincides with the curved line 14 in a wider voltage range than that of the above described second embodiment (the curved line 15' and the curved line 14).

In the third embodiment, therefore, the fact that negative admittance $-1/(\omega_0 Z \tan \beta 1)$ equivalently obtained from the strip shaped line 3 (length 1) is connected to the variable capacitance diode 2 is utilized. The length 1 of the strip shaped line 3 is selected so that the sum of the capacitance of the variable capacitance diode 2 and the above described admittance will be substantially in inverse proportion to the first to second power of the control voltage. In other words, if the $C_V$ characteristic of the variable capacitance diode 2 is in proportion to the kth (where ½<k<2) power of the control voltage V, then the above described capacitance $C_T$ characteristic is set so as to be in the range of first to second power of the control voltage V by using the strip shaped line 3 having a length of ¼ wavelength to 1/14 wavelength.

Thus, in this third embodiment, the same effect as that of the second embodiment is obtained. In addition, it is possible to use a line length which is equal to twice that of the second embodiment using the variable capacitance diode which is in inverse proportion to the half power of the control voltage. Furthermore, it is possible to prevent lowering in design efficiency and reproducibility resulting from the line length l of the strip shaped line 3 being too short. In the present embodiment, the case where the variable capacitance diode 3 is used has been described. However, the present embodiment is not limited thereto. For example, a Schottky diode or a field effect transistor (FET) can also be utilized for frequency modulation.

Figure 11:
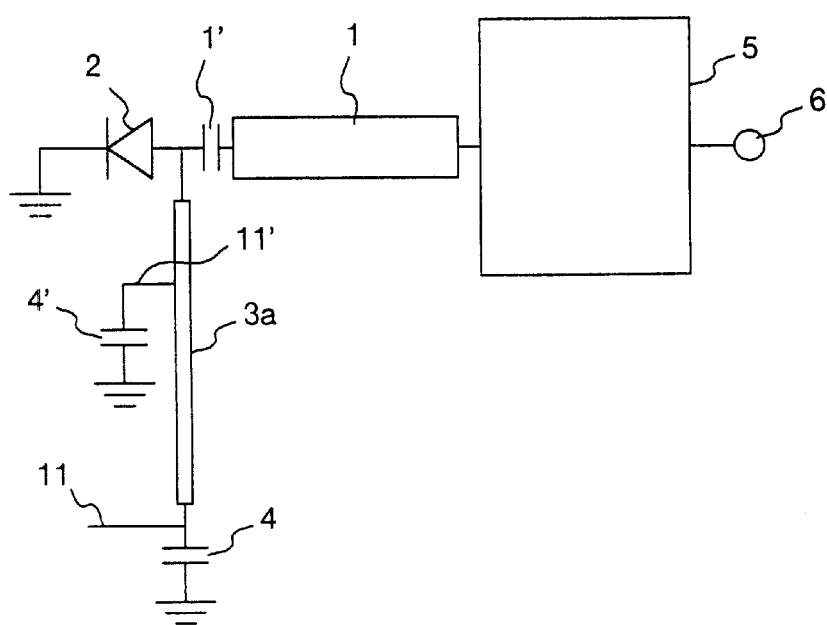
FIG. 11 is a diagram showing a configuration of a fourth embodiment in a microwave voltage controlled oscillator according to the present invention.

FIG. 11 is a diagram showing the configuration of a fourth embodiment of a microwave voltage controlled oscillator according to the present invention. The same components as those of the first embodiment described earlier are denoted by same legends and description thereof will be omitted. In FIG. 11, 3a denotes a strip shaped line, 4' capacitance (a capacitor), and 11' a terminal for connecting the strip shaped line 3a to the ground in an arbitrary position.

In this microwave voltage controlled oscillator, the negative resistance circuit 5 is connected to a first terminal of a strip shaped resonator 1, and anode of the variable capacitance diode 2 is connected to a second terminal of the strip shaped resonator 1 via capacitance 1'. Cathode of the variable capacitance diode is connected to the ground, and a first end of the high impedance strip shaped line 3a is connected to the anode of the variable capacitance diode 2. A second end of the strip shaped line 3a is connected to the ground via capacitance 4 which is sufficiently low impedance at the oscillation frequency. Furthermore, the length of the strip shaped line 3a is set to a range of at most a quarter of wavelength.

Furthermore, as a method for implementing the operation of the first embodiment by using the strip shaped line 3a having a fixed length, in the present embodiment, the strip shaped line 3a having a length of, for example, ¼ wavelength is used. Furthermore, the strip shaped line 3a is connected to the ground via capacitance 4' having sufficiently low impedance at the oscillation frequency, in a predetermined position depending on a $C_V$ characteristic of the variable capacitance diode 2 in use. In other words, a short circuit point in the strip shaped line 3a can be arbitrarily set.

Thus, in the fourth embodiment, the same effect as that of the first embodiment is obtained. In addition, the line length l of the strip shaped line 3 is fixed to ¼ wavelength, and the strip shaped line 3 is connected to the ground in an arbitrary position. Without limiting the kind of the variable capacitance diode 2, therefore, fine adjustment can be performed so as to absorb dispersion of the $C_V$ characteristic of the variable capacitance diode 2. As a result, the linearity of the frequency modulation can be further remarkably improved.

As explained above, the line length of the strip shaped line is made equal to a value in the range of ¼ wavelength to 1/14 wavelength in the present invention. As a result, it is possible to obtain a microwave voltage controlled oscillator capable of remarkably improving the linearity of the frequency modulation as compared with, for example, the case where frequency control is effected by using only a diode.

Furthermore, by determining the length of the strip shaped line so that sum of capacitance of the variable capacitance diode and the admittance will be in inverse proportion to the first to second power of the control voltage, there is brought about an effect that a microwave voltage controlled oscillator capable of remarkably improving the conventional linearity index can be obtained. Furthermore, since the remarkable improvement of the linearity index can facilitate the application of the linearizer, an oscillator for crash preventing radar can be effectively implemented.

Furthermore, by fixing the line length of the strip shaped line to ¼ wavelength and connecting the strip shaped line to the ground in an arbitrary position, fine adjustment can be conducted so as to absorb dispersion of the $C_V$ characteristic of the variable capacitance diode without limiting the kind of the variable capacitance diode. As a result, the linearity of the frequency modulation can be further remarkably improved.

Furthermore, even in the case where a Schottky diode or an FET diode is used, the linearity of the frequency modulation can be remarkably improved as compared with the conventional technique.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A microwave voltage controlled oscillator comprising:
   a negative resistance circuit having an input terminal and an output terminal;
   a strip shaped resonator having a first terminal and a second terminal, said first terminal of said strip shaped resonator being connected to said input terminal of said negative resistance circuit;
   a first capacitor having a first terminal and a second terminal, said first terminal of said first capacitor being connected to said second terminal of said strip shaped resonator;
   a variable capacitance diode having an anode and a cathode, said anode of said variable capacitance diode being connected to said second terminal of said first capacitor, and said cathode of said variable capacitance diode being grounded;

a strip shaped line having a high impedance, a first terminal, a second terminal, and a length, the length of said strip shaped line being shorter than ¼ wavelength, and equal to or longer than ¹⁄₁₄ wavelength, said first terminal of said strip shaped line being connected to said anode of said variable capacitance diode; and a second capacitor having a first terminal and a second terminal, said second capacitor having sufficiently low impedance at oscillation frequency, said first terminal of said second capacitor being connected to said second terminal of said strip shaped line, and said second terminal of said second capacitor being grounded, wherein a capacitance of said variable capacitance diode is inversely proportional to a control voltage raised to the power of equal to or greater than ½ and less than 2.

2. The microwave voltage controlled oscillator according to claim 1, wherein a Schottky diode or a field-effect transistor diode is used as the variable capacitance diode.

3. A microwave voltage controlled oscillator comprising:

a negative resistance circuit having an input terminal and an output terminal;

a strip shaped resonator having a first terminal and a second terminal, said first terminal of said strip shaped resonator being connected to said input terminal of said negative resistance circuit;

a first capacitor having a first terminal and a second terminal, said first terminal of said first capacitor being connected to said second terminal of said strip shaped resonator;

a variable capacitance diode having an anode and a cathode, said anode of said variable capacitance diode being connected to said second terminal of said first capacitor, and said cathode of said variable capacitance diode being grounded;

a strip shaped line having a high impedance, a first terminal, a second terminal, and a length, the length of said strip shaped line being in the range of ¹⁄₁₂ wavelength to ¹⁄₁₄ wavelength, said first terminal of said strip shaped line being connected to said anode of said variable capacitance diode; and a second capacitor having a first terminal and a second terminal, said second capacitor having sufficiently low impedance at oscillation frequency, said first terminal of said second capacitor being connected to said second terminal of said strip shaped line, and said second terminal of said second capacitor being grounded, wherein a capacitance of said variable capacitance diode is inversely proportional to a control voltage raised to the power of ½, and by utilizing a fact that a negative admittance equivalently obtained from the strip shaped line is connected to the variable capacitance diode, the length of the strip shaped line is determined so that a sum of the capacitance of the variable capacitance diode and the admittance will be in inverse proportion to the control voltage.

4. The microwave voltage controlled oscillator according to claim 3, wherein a Schottky diode or a field-effect transistor diode is used as the variable capacitance diode.

5. A microwave voltage controlled oscillator comprising:

a negative resistance circuit having an input terminal and an output terminal;

a strip shaped resonator having a first terminal and a second terminal, said first terminal of said strip shaped resonator being connected to said input terminal of said negative resistance circuit;

a first capacitor having a first terminal and a second terminal, said first terminal of said first capacitor being connected to said second terminal of said strip shaped resonator;

a variable capacitance diode having an anode and a cathode, said anode of said variable capacitance diode being connected to said second terminal of said first capacitor, and said cathode of said variable capacitance diode being grounded;

a strip shaped line having a high impedance, a first terminal, a second terminal, and a length, the length of said strip shaped line being in the range of ¹⁄₂₄ wavelength to ¹⁄₂₈ wavelength, said first terminal of said strip shaped line being connected to said anode of said variable capacitance diode; and a second capacitor having a first terminal and a second terminal, said second capacitor having sufficiently low impedance at oscillation frequency, said first terminal of said second capacitor being connected to said second terminal of said strip shaped line, and said second terminal of said second capacitor being grounded, wherein a capacitance of said variable capacitance diode is inversely proportional to a control voltage raised to the power of ½, and by utilizing a fact that a negative admittance equivalently obtained from the strip shaped line is connected to the variable capacitance diode, the length of the strip shaped line is determined so that a sum of the capacitance of the variable capacitance diode and the admittance will be in inverse proportion to first to the control voltage raised to the power of 2.

6. The microwave voltage controlled oscillator according to claim 5, wherein a Schottky diode or a field-effect transistor diode is used as the variable capacitance diode.

7. A microwave voltage controlled oscillator comprising:

a negative resistance circuit having an input terminal and an output terminal;

a strip shaped resonator having a first terminal and a second terminal, said first terminal of said strip shaped resonator being connected to said input terminal of said negative resistance circuit;

a first capacitor having a first terminal and a second terminal, said first terminal of said first capacitor being connected to said second terminal of said strip shaped resonator;

a variable capacitance diode having an anode and a cathode, said anode of said variable capacitance diode being connected to said second terminal of said first capacitor, and said cathode of said variable capacitance diode being grounded;

a strip shaped line having a high impedance, a first terminal, a second terminal, a third terminal, and a length, the length of said strip shaped line being fixed to ¼ wavelength, said first terminal of said strip shaped line being connected to said anode of said variable capacitance diode;

a second capacitor having a first terminal and a second terminal, said second capacitor having sufficiently low impedance at oscillation frequency, said first terminal of said second capacitor being connected to said second terminal of said strip shaped line, and said second terminal of said second capacitor being grounded; and a third capacitor having a first terminal and a second terminal, said third capacitor having a sufficiently low impedance at oscillation frequency, said first terminal of said third capacitor being connected to said third terminal of said strip shaped line, and said second terminal of said third capacitor being grounded, wherein said third terminal of said strip shaped line is provided in a position depending on a characteristic of the variable capacitance diode in use.

8. The microwave voltage controlled oscillator according to claim 7, wherein a Schottky diode or a field-effect translator diode is used as the variable capacitance diode.

9. A microwave voltage controlled oscillator comprising:

a negative resistance circuit having an input terminal and an output terminal;

a strip shaped resonator having a first terminal and a second terminal, said first terminal of said strip shaped resonator being connected to said input terminal of said negative resistance circuit;

a first capacitor having a first terminal and a second terminal, said first terminal of said first capacitor being connected to said second terminal of said strip shaped resonator;

a variable capacitance diode having an anode and a cathode, said anode of said variable capacitance diode being connected to said second terminal of said first capacitor, and said cathode of said variable capacitance diode being grounded;

a strip shaped line having a high impedance, a first terminal, a second terminal, and a length, the length of said strip shaped line being shorter than ¼ wavelength, and equal to or longer than $1/14$ wavelength, said first terminal of said strip shaped line being connected to said anode of said variable capacitance diode; and a second capacitor having a first terminal and a second terminal, said second capacitor having sufficiently low impedance at oscillation frequency, said first terminal of said second capacitor being connected to said second terminal of said strip shaped line, and said second terminal of said second capacitor being grounded, wherein a capacitance of said variable capacitance diode is inversely proportional to a control voltage, and by utilizing a fact that a negative admittance equivalently obtained from the strip shaped line is connected to the variable capacitance diode, the length of the strip shaped line is determined so that a sum of the capacitance of the variable capacitance diode and the admittance will be in inverse proportion to the control voltage raised to the power of 2.

10. The microwave voltage controlled oscillator according to claim 9, wherein a Schottky diode or a field-effect transistor diode is used as the variable capacitance diode.

* * * * *

UNITED STATES PATENT AND TRADEMARK OFFICE
CERTIFICATE OF CORRECTION

PATENT NO.    : 6,600,381 B2                                Page 1 of 1
DATED         : July 29, 2003
INVENTOR(S)   : Tokumitu et al.

It is certified that error appears in the above-identified patent and that said Letters Patent is hereby corrected as shown below:

<u>Title page, Item [54] and Column 1, line 1,</u>
Please remove the hyphens from the title to read as follows:
-- MICROWAVE VOLTAGE CONTROLLED OSCILLATOR --

<u>Title page,</u>
Item [75], Inventors, please change the address of the Inventors from "Nakakoma (JP)" to -- Yamanashi (JP) --

Signed and Sealed this

Sixth Day of January, 2004

JAMES E. ROGAN
*Director of the United States Patent and Trademark Office*